(12) United States Patent
Isik

(10) Patent No.: US 8,316,245 B1
(45) Date of Patent: Nov. 20, 2012

(54) METHOD AND APPARATUS FOR FAIL-SAFE START-UP CIRCUIT FOR SUBTHRESHOLD CURRENT SOURCES

(75) Inventor: Tacettin Isik, Saratoga, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 814 days.

(21) Appl. No.: 12/333,149

(22) Filed: Dec. 11, 2008

(51) Int. Cl.
*H03L 7/00* (2006.01)

(52) U.S. Cl. ........ 713/300; 713/330; 713/340; 327/142; 327/143; 327/198

(58) Field of Classification Search .............. 713/30, 713/330, 340; 327/142, 143, 198
See application file for complete search history.

(56) References Cited

U.S. PATENT DOCUMENTS

| | | | | |
|---|---|---|---|---|
| 4,169,272 | A * | 9/1979 | Rains et al. .................... | 348/581 |
| 4,956,618 | A * | 9/1990 | Ulmer ..................... | 331/116 FE |
| 5,939,949 | A * | 8/1999 | Olgaard et al. ................. | 331/17 |
| 6,545,625 | B2 * | 4/2003 | Hottgenroth .................. | 341/155 |
| 7,015,732 | B1 * | 3/2006 | Holloway et al. ............. | 327/143 |
| 7,015,744 | B1 * | 3/2006 | Holloway et al. ............. | 327/541 |
| 7,616,074 | B2 * | 11/2009 | Toffolon et al. .............. | 331/185 |
| 7,706,116 | B2 * | 4/2010 | Liu et al. ...................... | 361/93.1 |
| 2007/0057649 | A1 * | 3/2007 | Yang ............................. | 323/222 |
| 2007/0145981 | A1 * | 6/2007 | Tomita et al. ................. | 324/509 |
| 2008/0200135 | A1 * | 8/2008 | Chung .......................... | 455/130 |

* cited by examiner

*Primary Examiner* — M Elamin
(74) *Attorney, Agent, or Firm* — Heimlich Law, PC; Alan Heimlich, Esq.

(57) ABSTRACT

A method and apparatus for fail-safe start-up circuit for subthreshold current sources have been disclosed.

14 Claims, 8 Drawing Sheets

| Box | Content |
|---|---|
| 801 | An apparatus comprising counting means for controlling current to a current source during power up. |
| 802 | Counting means is operatively coupled to fully discharge a charge storage device when said current source is powered up. |
| 803 | An oscillator operatively coupled to said counting means |
| 804 | A first comparison circuit having one or more inputs and an output, said first comparison circuit one or more inputs operatively coupled to said counting means and said first comparison circuit output operatively coupled to reset said counting means. |
| 805 | A second comparison circuit having one or more inputs and an output, said second comparison circuit one or more inputs operatively coupled to said counting means and said second comparison circuit output operatively coupled to control said current to said current source. |
| 806 | Said charge storage device is a capacitor, said means for controlling current is a transistor means, said counting means is a ripple counter means, said first comparison circuit is a logic circuit, and said second comparison circuit is a logic circuit. |
| 815 | A second logic circuit having an input and an output, said second logic circuit input operatively coupled to said counter output and said second logic circuit output operatively coupled to said counter. |
| 816 | Said second logic circuit input further comprises a plurality of inputs, said plurality of second logic circuit inputs operatively coupled to one or more outputs from said counter. |

800

| Box | Content |
|---|---|
| 807 | A method comprising increasing current to a current source during a power-up; counting pulses from an oscillator during said power-up; determining when said counted pulses reach a criteria; and decreasing current to said current source when said criteria is reached. |
| 808 | Said criteria is substantially an equal number of positive and negative pulses. |
| 809 | Said criteria is pre-specified count. |
| 810 | Said decreasing current comprises turning off a transistor. |
| 811 | Charging a capacitor coupled to an oscillator during said power-up; and discharging said capacitor when said criteria is reached. |
| 812 | An apparatus comprising: a first switch operatively coupled shunting an existing current flow; a delay element having an input and an output, said delay element input operatively coupled to a charging circuit; a counter having an input and an output, said counter input operatively coupled to said delay element output; a logic circuit having an input and an output, said logic circuit input operatively coupled to said counter output; and said logic circuit output operatively coupled to said first switch. |
| 813 | A second switch operatively coupled shunting a charging element in said charging circuit; and said logic circuit output operative coupled to said second switch. |
| 814 | Said logic circuit input further comprises a plurality of inputs, said plurality of logic circuit inputs operatively coupled to one or more outputs from said counter. |

FIG. 8

METHOD AND APPARATUS FOR FAIL-SAFE START-UP CIRCUIT FOR SUBTHRESHOLD CURRENT SOURCES

FIELD OF THE INVENTION

The present invention pertains to current sources. More particularly, the present invention relates to a method and apparatus for fail-safe start-up circuit for subthreshold current sources.

BACKGROUND OF THE INVENTION

Ultra low power analog circuits often require a current reference. Known self biased current generators may be used for this purpose, however, starting up such a current source is not straightforward which presents a problem.

Starting analog circuits has always been tricky. For example, making sure a same exact state is reliably reached after power is turned-on repeatedly has been a challenging engineering problem. Current approaches suffer weakness such as being affected by process variations, not starting up repeatedly if the power cycles are too close in time, etc. This presents a problem.

Additionally most approaches address high current applications. Ultra low power circuits need special attention to current consumption, so solutions for high current applications present a problem for ultra low current circuits.

FIG. 3 illustrates a prior approach, generally, at 300. At 302 is voltage rail such as Vdd, and at 304 a ground rail. FIG. 3 illustrates a simplified circuit for a self-biased current source. This current source may have two stable points one of them which gives zero (0) current. This presents a problem.

FIG. 4 illustrates a prior approach, generally, at 400. At 402 is voltage rail such as Vdd, at 404 a ground rail, at 406 a capacitor C, and at 408 a node. FIG. 4 illustrates one attempt at avoiding the zero current startup mode. A capacitive discharge technique is used. In this implementation, node 408 is pulled to Vdd when the power supply (such as Vdd) ramp is applied. A problem with this approach is that it is not guaranteed to have C discharged every time the power ramp is applied. Also depending on the charge that C carries during the power ramp, the circuit may or may not reach the stable non-zero current operating point. It is possible that the circuit may revert be back to "zero" current mode. Besides, any transient may affect the situation in such a way that a circuit may start before supply voltage reaches to a usable value. This may be prone to have transient effects more. Start up time is not really guaranteed. This presents a problem.

BRIEF DESCRIPTION OF THE DRAWINGS

The invention is illustrated by way of example and not limitation in the figures of the accompanying drawings in which:

FIG. 8 illustrates embodiments of the invention.

SUMMARY OF THE INVENTION

Figure 1:
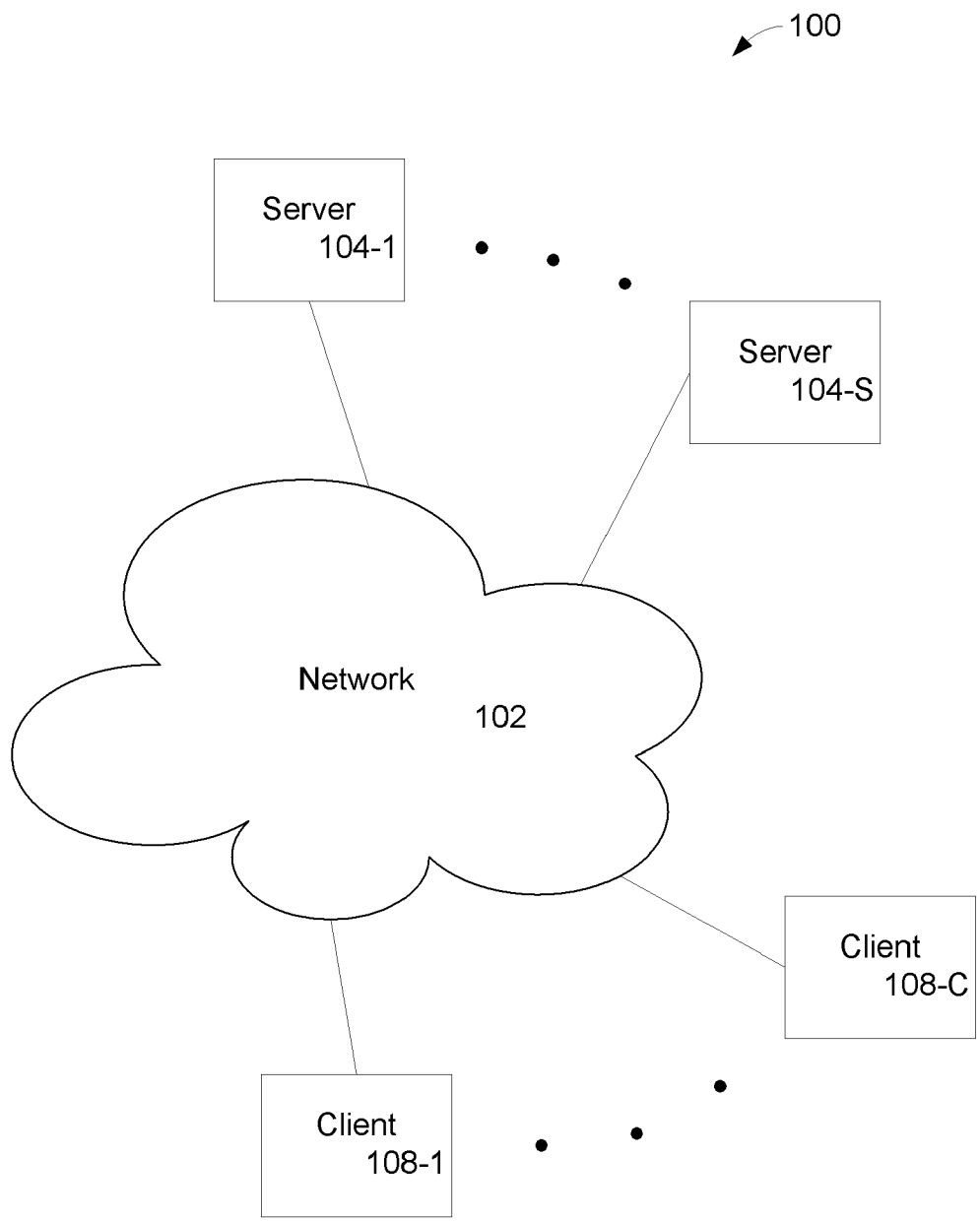
FIG. 1 illustrates a network environment in which the method and apparatus of the invention may be implemented.

A method and apparatus for a fail-safe start-up circuit for subthreshold current sources is disclosed. In one approach an apparatus using a counting method is used for controlling current to a current source during power up. Another approach increases current to a current source during a power-up, counts pulses from an oscillator during power-up, determines when the counted pulses reach a criteria, and then decreases the current to the current source when the criteria is reached. Another approach uses a switch connected so it can shunt an existing current flow, a delay element whose input is coupled to a charging circuit, a counter whose input is coupled to the delay element output, a logic circuit whose input is coupled to the counter output, and the logic circuit output operating the switch. These and other embodiments of the present invention are described in the writings and drawings herewith.

DETAILED DESCRIPTION

In one embodiment of the invention, current generators start-up by running an oscillator and counting pulses until the count reaches a value that has an equivalent number (or substantially equal number) of '1' s and '0's and then locks out and gets ready for the next power on cycle.

In one embodiment of the invention, in order to initiate a self biased current generator, an auxiliary current is used to pull at least one side up or the other side down. This current source should be turned off after start-up is assured.

In one embodiment of the invention, the auxiliary current is applied until certain conditions are met. For example, in one embodiment of the invention, these conditions are, to run a simple oscillator, count the pulses, detect the count reached to a certain number that has equal numbers of '1' s and '0's. Since such a condition only happens if the circuits are reliably operating, the current source is assured of its normal condition.

Failsafe Startup Circuit for Subthreshold Current Sources.

Ultralow power analog circuits are used for small battery operated electronic systems. CMOS analog circuits are preferred for these applications because subthreshold (weak inversion) region operation of transistors allows very low current consumption which may be in the nanoamps level. One of the building blocks of such circuits is a self-biased current reference. A challenge with a self-biased current source is to have it started safely when the power supply is turned on. Safe startup requires consistency from one operation to another and making sure all circuits in the application are receiving a large enough power supply voltage to operate reliably. It is during the turn-on phase of the power, when the supply voltage is going from, for example, zero to an operating value that noise, non-monotonic ramping, etc. poses a challenge.

To ensure proper operation of an application, the start-up mode of operation is extended until some representation of the entire application starts working. In one embodiment of the invention, a circuit increases the current source current, utilizes the reference current that charges a capacitor that is an integral part of an oscillator, counts the pulses to a certain amount, and then locks itself in off condition to reduce the power consumption further.

Theory of Operation:

In one embodiment of the invention to avoid a self biased current source from starting in a zero current mode, a controlled current is supplied to a node. This current is supplied to the node even while the power supply itself may not yet be stable.

Figure 5:
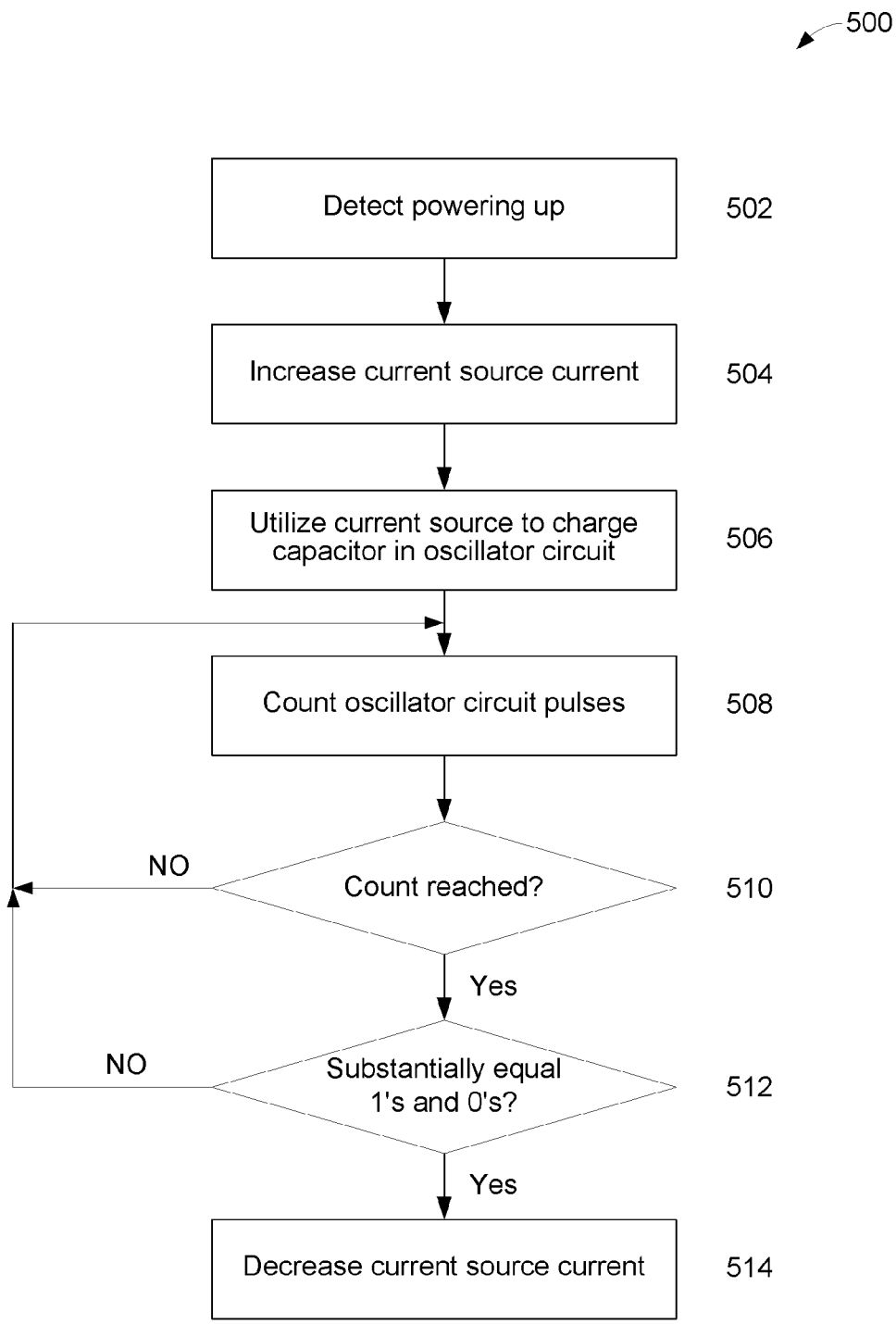
FIG. 5 illustrates one embodiment of the invention in flow chart form.

FIG. 5 illustrates, generally at 500, one embodiment of the invention. At 502 powering up is detected. At 504 current source current is increased. At 506 the current source is utilized to charge a capacitor in an oscillator circuit. At 508 the oscillator circuit pulses are counted. At 510 a check is made to see of a count has been reached; if not then counting continues at 508; if so then a check is made at 512. At 512 a check is made to see if there are a substantially equal number of 1's and 0's from the oscillator circuit; if not then counting continues at 508; if so then at 514 the current source current is decreased.

Figure 4:
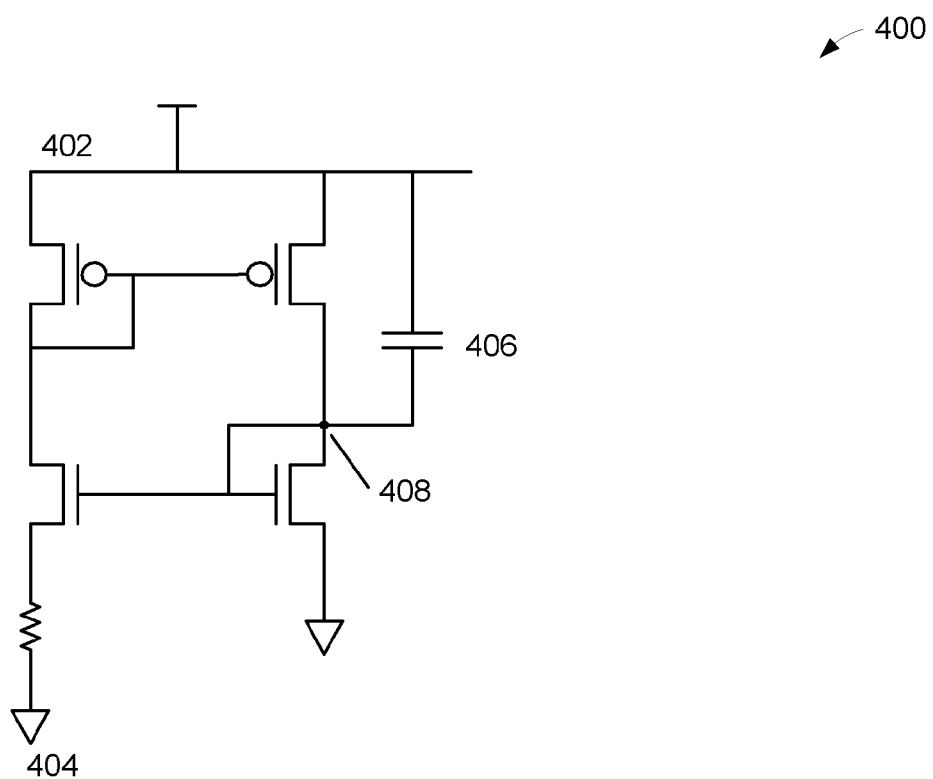
Figure 6:
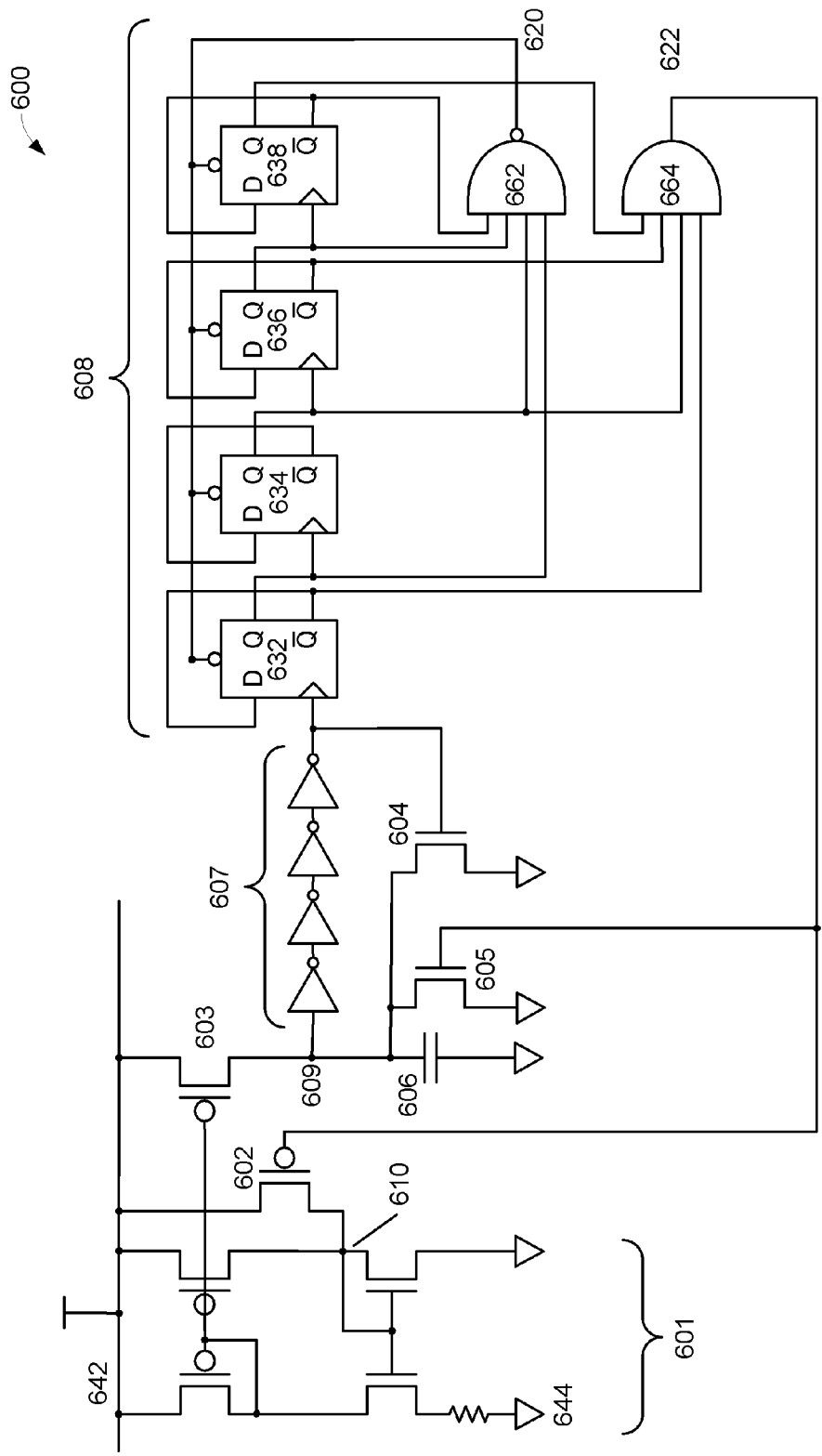
FIG. 6 illustrates one embodiment of the invention in schematic form.

FIG. 6 illustrates, generally at 600, one embodiment of the invention. At 601 is a self-biased current source. At 602 is a switch. In one embodiment 602 is a long channel PMOS transistor device. For discussion purposes switch 602 may be considered to be "taking" the place of a capacitor C, such as in FIG. 4 at 406. In one embodiment the gate of this transistor is driven by a circuit that generates a feedback signal from the current output of the self biased current source. The current output is achieved by adding another PMOS device 603. If PMOS 602 is on, current from drain terminal of 603 is significantly larger. If NMOS devices 604 and 605 are turned off, capacitor 606 will be charged by this current. It must be insured that 606 is discharged and 604 and 605 are off at the beginning. This will be discussed later in this text.

When node 609 reaches the logic threshold of the first inverter of the chain 607, a transition ripples through the chain and NMOS 604 turns on, discharging 606, creating another transition in the chain to turn 604 off. This positive feedback constitutes an oscillator and insures that 604 would not be an obstacle to the condition for discharging 606.

The output of the chain 607 is fed into, in one embodiment of the invention, an asynchronous ripple counter (632, 634, 636, 638) with N×D flip flops. N is chosen to be 4 in this example. In one embodiment all the flip flops start with a same state. One skilled in the art will appreciate that the flip flops may be made to start in a similar state by various techniques, for example, asymmetrical structures, loading on a particular output, etc. Based on the idea of a series of flip flops starting in a similar state (desirable, but not required) a preset (PS) and lock-out (LO) signal may be generated. In one embodiment it is desirable to have states that are equal number of "1"s and "0"s to generate the lock-out signal as it is more likely to indicate proper operation of the circuit.

NAND gate 662 receives inputs from the counter and generates a Preset (PS) signal at output 620. This preset is generated when the counter has a count value of 0111. AND gate 664 receives input from the counter and generates a lock-out (LO) signal at output 622. This lock-out is generated when the counter has a count value of 1010.

If the count value ever reaches the preset value the counter starts over from 1111. The next count will be 1110, then 1101, and so on due to the count-down nature of asynchronous ripple counters. Therefore a smaller value for preset must be chosen with respect to the lock-out value, otherwise the lock-out value will not be reached.

When lock-out is reached NMOS 605 will be turned on, stopping the oscillation, PMOS 602 will be turned off, cutting down the extra startup current to node 610. Since the same power supply (642, 644) is used for the logic part and the oscillator (603-609, and 662-664) as the current source (601), this point of events should be reached safely.

Based on the desire, as mentioned earlier that all or most flip-flops start with the same state, NMOS 605 must start with a turned-off condition. To increase this possibility, one can increase the number of flip flops even further.

Another advantage of this technique disclosed is that in a circuit it is insured that capacitor 606 will stay discharged for the next power cycle.

One of skill in the art will appreciate that there are many possible embodiments for the techniques described. For example D type flip flops with resets may be used.

Figure 7:
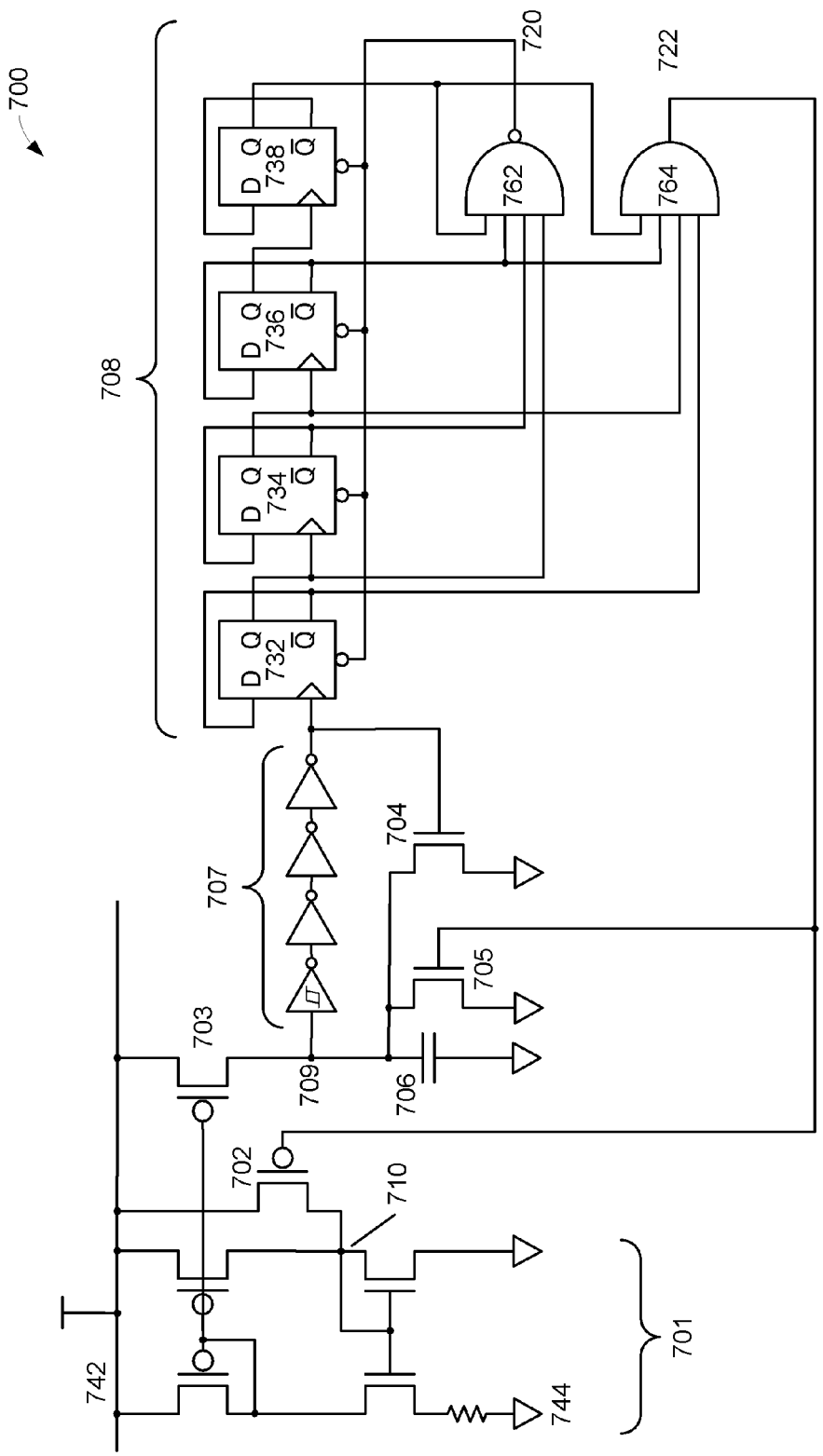
FIG. 7 illustrates one embodiment of the invention in schematic form.

FIG. 7 illustrates, generally at 700, one embodiment of the invention. At 701 is a self-biased current source. At 702 is a switch. In one embodiment 702 is a long channel PMOS transistor device. For discussion purposes switch 702 may be considered to be "taking" the place of a capacitor C, such as in FIG. 4 at 406. In one embodiment the gate of this transistor is driven by a circuit that generates a feedback signal from the current output of the self biased current source. The current output is achieved by adding another PMOS device 703. If PMOS 702 is on, current from drain terminal of 703 is significantly larger. If NMOS devices 704 and 705 are turned off, capacitor 706 will be charged by this current. It must be insured that 706 is discharged and 704 and 705 are off at the beginning. This will be discussed later in this text.

When node 709 reaches the logic threshold of the first inverter (a hysteresis inverter) of the chain 707, a transition ripples through the chain and NMOS 704 turns on, discharging 706, creating another transition in the chain to turn 704 off. This positive feedback constitutes an oscillator and insures that 704 would not be an obstacle to the condition for discharging 706.

The output of the chain 707 is fed into, in one embodiment of the invention, an asynchronous ripple counter (732, 734, 736, 738) with N×D flip flops. N is chosen to be 4 in this example. Normally, it is not advisable to use flip flops in startup circuits because it is unknown which initial state they will have during this event. However in this embodiment they yield an unexpected benefit. If the flip flops physical structures are the same (as can be reasonably expected in an IC), it is highly likely that all will start with a same state. Additionally, the flip flops may be made to start in a similar state by various techniques, for example, asymmetrical structures, loading on a particular output, etc. Based on the idea of a series of flip flops starting in a similar state (desirable, but not required) a reset (RS) and lock-out (LO) signal may be generated. It is desirable to have states that are equal number of "1"s and "0"s to generate these signals because it is most unlikely that the flip flops which are similar in construction will initialize in such a state.

NAND gate 762 receives inputs from the counter and generates a reset (RS) signal at output 620. This reset is generated when the counter has a count value of 1001. AND gate 664 receives input from the counter and generates a lock-out (LO) signal at output 622. This lock-out is generated when the counter has a count value of 1010.

If the count value ever reaches the reset value the counter starts over from 0000. If the lock-out value is reached before the reset value is reached, reset will not occur, however, the reset operation is not needed. If reset value is reached it causes the counter to start over from 0000, and the next count will be 1111, then 1110, so on, due to the count-down nature of asynchronous ripple counters used in this embodiment. Therefore a smaller value for reset must be chosen with respect to lock-out value.

When lock-out is reached NMOS 705 will be turned on, stopping the oscillation, PMOS 702 will be turned off, cutting down the extra startup current to node 710. Since the same power supply (742, 744) is used for the logic part and the oscillator (703-709, and 762-764) as the current source (701), this point of events should be reached safely.

Based on the desire, as mentioned earlier that all or most flip-flops start with the same state, NMOS 705 must start with a turned-off condition. To increase this possibility, one can increase the number of flip flops even further.

Another advantage of this technique disclosed is that in a circuit it is insured that capacitor 706 will stay discharged for the next power cycle.

FIG. 8 illustrates, generally at 800, embodiments of the invention. At 801 an apparatus comprising counting means for controlling current to a current source during power up. At 802 counting means is operatively coupled to fully discharge a charge storage device when said current source is powered up. At 803 an oscillator operatively coupled to said counting means. At 804 a first comparison circuit having one or more inputs and an output, said first comparison circuit one or more inputs operatively coupled to said counting means and said first comparison circuit output operatively coupled to reset said counting means. At 805 a second comparison circuit having one or more inputs and an output, said second comparison circuit one or more inputs operatively coupled to said counting means and said second comparison circuit output operatively coupled to control said current to said current source. At 806 said charge storage device is a capacitor, said means for controlling current is a transistor means, said counting means is a ripple counter means, said first comparison circuit is a logic circuit, and said second comparison circuit is a logic circuit. At 807 a method comprising increasing current to a current source during a power-up; counting pulses from an oscillator during said power-up; determining when said counted pulses reach a criteria; and decreasing current to said current source when said criteria is reached. At 808 said criteria is substantially an equal number of positive and negative pulses. At 809 said criteria is pre-specified count. At 810 said decreasing current comprises turning off a transistor. At 811 charging a capacitor coupled to an oscillator during said power-up; and discharging said capacitor when said criteria is reached. At 812 an apparatus comprising: a first switch operatively coupled shunting an existing current flow; a delay element having an input and an output, said delay element input operatively coupled to a charging circuit; a counter having an input and an output, said counter input operatively coupled to said delay element output; a logic circuit having an input and an output, said logic circuit input operatively coupled to said counter output; and said logic circuit output operatively coupled to said first switch. At 813 a second switch operatively coupled shunting a charging element in said charging circuit; and said logic circuit output operative coupled to said second switch. At 814 said logic circuit input further comprises a plurality of inputs, said plurality of logic circuit inputs operatively coupled to one or more outputs from said counter. At 815 a second logic circuit having an input and an output, said second logic circuit input operatively coupled to said counter output and said second logic circuit output operatively coupled to said counter. At 816 said second logic circuit input further comprises a plurality of inputs, said plurality of second logic circuit inputs operatively coupled to one or more outputs from said counter.

Thus a method and apparatus for fail-safe start-up circuit for subthreshold current sources have been described.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
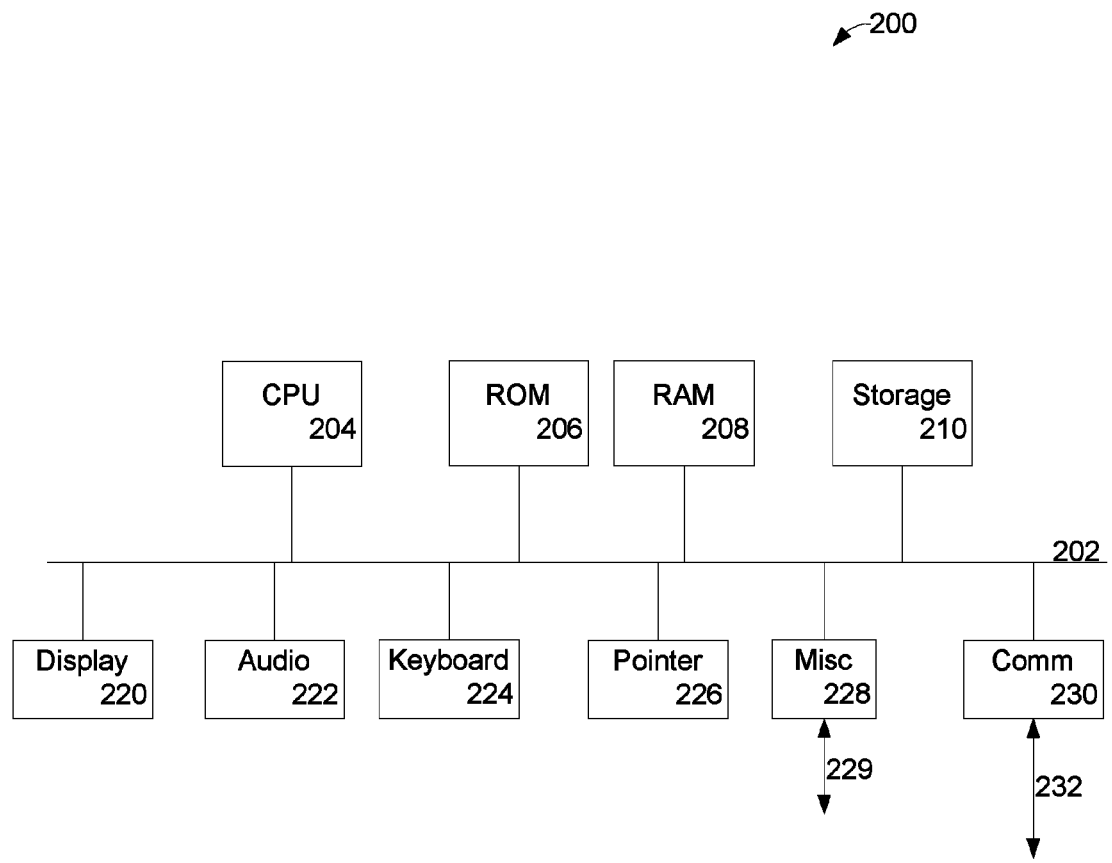
FIG. 2 is a block diagram of a computer system in which some embodiments of the invention may be used.
Figure 3:
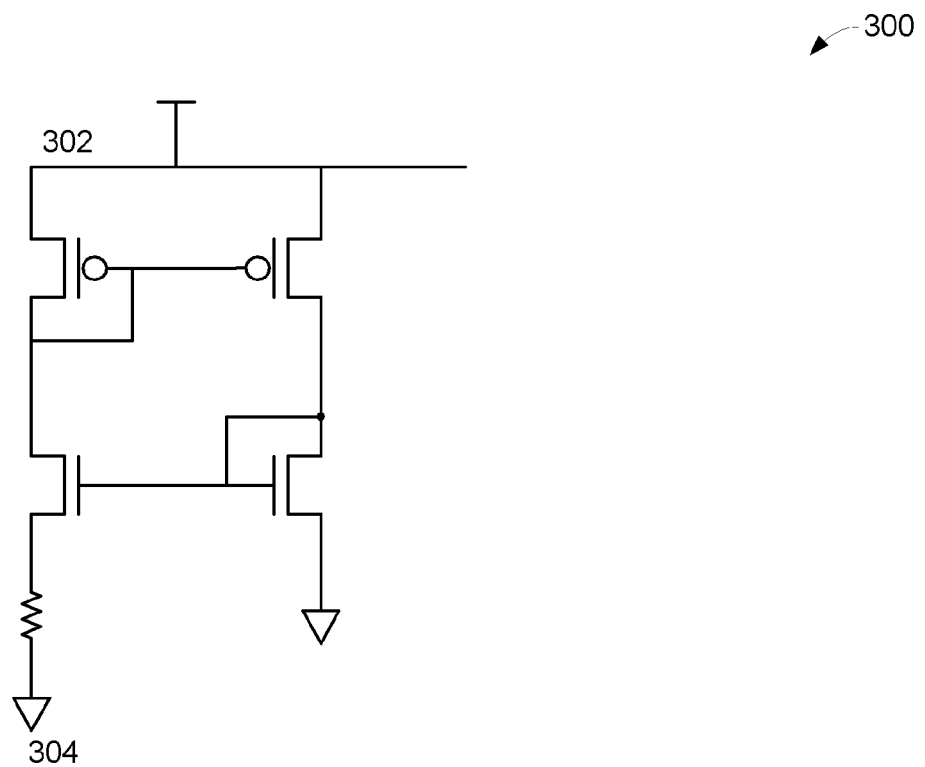
FIG. 3 and FIG. 4 illustrate prior approaches.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Various spellings may be used for terms used in the description. These variations are to be understood to relate to the same term unless denoted otherwise. For example: failsafe is also spelled fail safe, and failsafe; start-up is also spelled startup, and start up; subthreshold is also spelled sub-threshold, and sub threshold; etc.

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for fail-safe start-up circuit for subthreshold current sources have been described.

What is claimed is:

1. An apparatus comprising counting means for controlling current to a current source during power up, wherein said counting means is operatively coupled to fully discharge a charge storage device when said current source is powered up.

2. The apparatus of claim 1 further comprising an oscillator operatively coupled to said counting means.

3. The apparatus of claim 2 further comprising a first comparison circuit having one or more inputs and an output, said first comparison circuit one or more inputs operatively coupled to said counting means and said first comparison circuit output operatively coupled to reset said counting means.

4. The apparatus of claim 3 further comprising a second comparison circuit having one or more inputs and an output, said second comparison circuit one or more inputs operatively coupled to said counting means and said second comparison circuit output operatively coupled to control said current to said current source.

5. The apparatus of claim 4 wherein said charge storage device is a capacitor, said means for controlling current is a transistor means, said counting means is a ripple counter means, said first comparison circuit is a logic circuit, and said second comparison circuit is a logic circuit.

6. A method comprising:
increasing current to a current source during a power-up;
counting pulses from an oscillator during said power-up;
determining when said counted pulses reach a criteria; and
decreasing current to said current source when said criteria is reached, wherein said criteria is substantially an equal number of positive and negative pulses.

7. The method of claim 6 wherein said criteria is pre-specified count.

8. The method of claim 6 wherein said decreasing current comprises turning off a transistor.

9. A method comprising:
increasing current to a current source during a power-up;
counting pulses from an oscillator during said power-up;
determining when said counted pulses reach a criteria;
decreasing current to said current source when said criteria is reached;
charging a capacitor coupled to an oscillator during said power-up; and
discharging said capacitor when said criteria is reached.

10. An apparatus comprising:
a first switch operatively coupled shunting an existing current flow;
a delay element having an input and an output, said delay element input operatively coupled to a charging circuit;
a counter having an input and an output, said counter input operatively coupled to said delay element output;
a logic circuit having an input and an output, said logic circuit input operatively coupled to said counter output; and
said logic circuit output operatively coupled to said first switch.

11. The apparatus of claim 10 further comprising:
a second switch operatively coupled shunting a charging element in said charging circuit; and
said logic circuit output operative coupled to said second switch.

12. The apparatus of claim 10 wherein said logic circuit input further comprises a plurality of inputs, said plurality of logic circuit inputs operatively coupled to one or more outputs from said counter.

13. The apparatus of claim 12 further comprising a second logic circuit having an input and an output, said second logic circuit input operatively coupled to said counter output and said second logic circuit output operatively coupled to said counter.

14. The apparatus of claim 12 wherein said second logic circuit input further comprises a plurality of inputs, said plurality of second logic circuit inputs operatively coupled to one or more outputs from said counter.

* * * * *